(12) United States Patent
Lim

(10) Patent No.: US 9,780,237 B2
(45) Date of Patent: Oct. 3, 2017

(54) SOLAR CELL AND METHOD OF FABRICATING THE SAME

(71) Applicant: LG INNOTEK CO., LTD., Seoul (KR)

(72) Inventor: Chin Woo Lim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 68 days.

(21) Appl. No.: 14/352,351

(22) PCT Filed: Oct. 16, 2012

(86) PCT No.: PCT/KR2012/008446
§ 371 (c)(1),
(2) Date: Apr. 17, 2014

(87) PCT Pub. No.: WO2013/058523
PCT Pub. Date: Apr. 25, 2013

(65) Prior Publication Data
US 2015/0107661 A1    Apr. 23, 2015

(30) Foreign Application Priority Data
Oct. 17, 2011 (KR) .......... 10-2011-0106117

(51) Int. Cl.
*H01L 31/00* (2006.01)
*H01L 21/00* (2006.01)
(Continued)

(52) U.S. Cl.
CPC ........... *H01L 31/022466* (2013.01); *H01L 31/03923* (2013.01); *H01L 31/0749* (2013.01); *H01L 31/1884* (2013.01); *Y02E 10/541* (2013.01)

(58) Field of Classification Search
CPC ......... H01L 31/022466; H01L 31/1884; H01L 31/03923; H01L 31/0749; Y02E 10/541
(Continued)

(56) References Cited

U.S. PATENT DOCUMENTS 4,612,411 A * 9/1986 Wieting ............... H01L 31/0749
                                                    136/265
5,078,803 A * 1/1992 Pier et al. .................... 136/256
(Continued)

FOREIGN PATENT DOCUMENTS

JP    H10-144946 A    5/1998
JP    2009-111183 A   5/2009
(Continued)

OTHER PUBLICATIONS

Lee, Do-Joong, et al., "Structural and Electrical Properties of Atomic Layer Deposited Al-Doped ZnO Films", Advanced Functional Materials, 2011, 21, pp. 448-455.*
(Continued)

*Primary Examiner* — Tamir Ayad
(74) *Attorney, Agent, or Firm* — Saliwanchick, Lloyd & Eisenschenk

(57) ABSTRACT

According to the embodiment, there is provided a solar cell including: a back electrode layer; a light absorbing layer on the back electrode layer; a buffer layer on the light absorbing layer; and a front electrode layer on the buffer layer, wherein the front electrode layer comprises an intrinsic region and a doping region having a conductive dopant, and a concentration of the conductive dopant is gradually lowered in upward and downward directions from an excess doping region of the doping region.

5 Claims, 2 Drawing Sheets

(51) Int. Cl.
    *H01L 31/0224*     (2006.01)
    *H01L 31/0392*     (2006.01)
    *H01L 31/0749*     (2012.01)
    *H01L 31/18*     (2006.01)

(58) Field of Classification Search
    USPC .......................................... 136/256; 438/98
    See application file for complete search history.

(56) References Cited

U.S. PATENT DOCUMENTS

| | | | |
|---|---|---|---|
| 6,040,521 A | 3/2000 | Kushiya et al. | |
| 2009/0025791 A1* | 1/2009 | Matsui | H01L 31/02246 |
| | | | 136/261 |
| 2011/0108099 A1* | 5/2011 | Pinarbasi | H01L 31/02246 |
| | | | 136/255 |

FOREIGN PATENT DOCUMENTS

| | | |
|---|---|---|
| KR | 10-2011-0001792 A | 1/2011 |
| KR | 10-2011-0001814 A | 1/2011 |

OTHER PUBLICATIONS

Lee, Wangwoo et al., "Enhancement of the electrical properties of Al-doped ZnO films deposited on ZnO-buffered glass substrates by using an ultrathin aluminum underlayer", J Mater Sci (2008) 43:1159-1161. DOI 10.1007/s10853-007-2379-y.*

Hongsingthong, Aswin et al., "ZnO Films with Very High Haze Value for Use as Front Transparent Conductive Oxide Films in Thin-Film Silicon Solar Cells", Applied Physics Express 3 (2010) 051102, pp. 1-3.*

Tabuchi, Katsuya et al., "Optimization of ZnO Films for Amorphous Silicon Solar Cells", Jpn. J. Appl. Phys. Vol, 32 (1993) pp. 3764-3769, Part 1, No. 9A, Sep. 1993.*

International Search Report in International Application No. PCT/KR2012/008446, filed Oct. 16, 2012.

* cited by examiner

[Fig. 1]
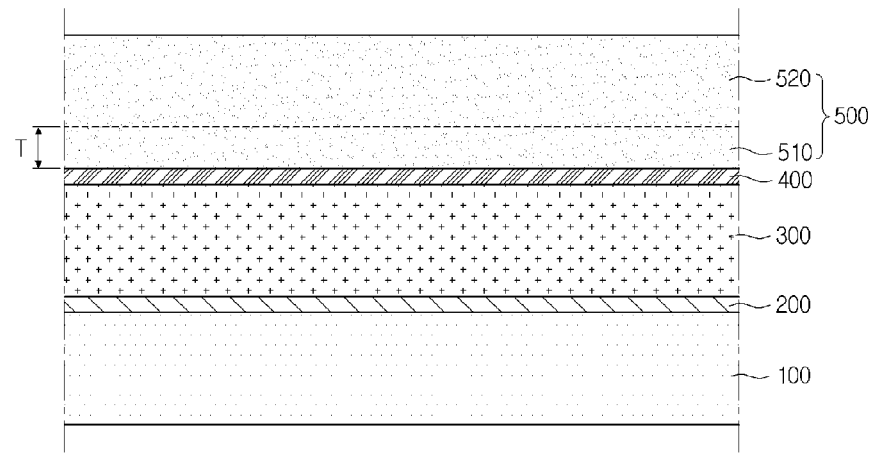
[Fig. 2]
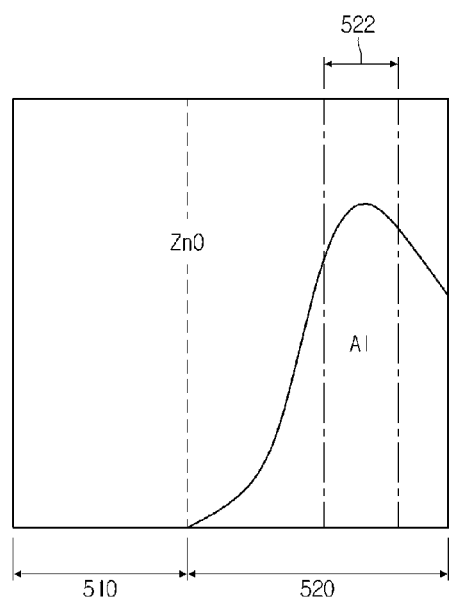
[Fig. 3]
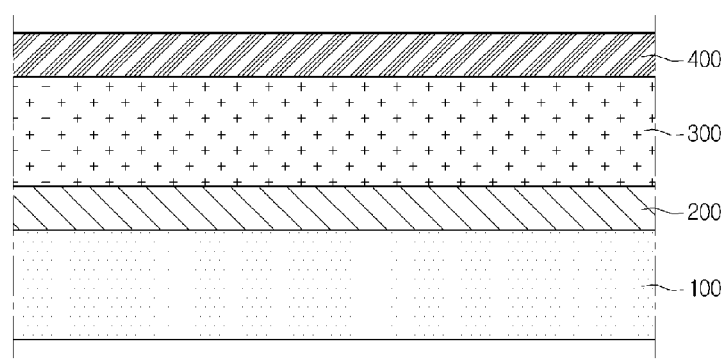

[Fig. 4]
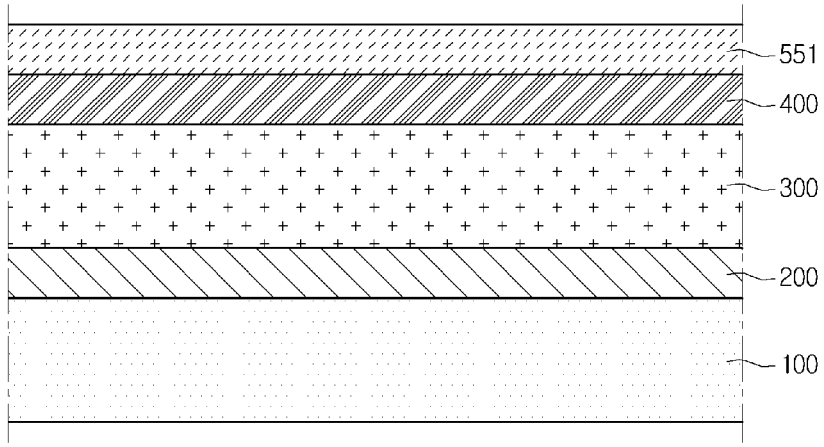
[Fig. 5]
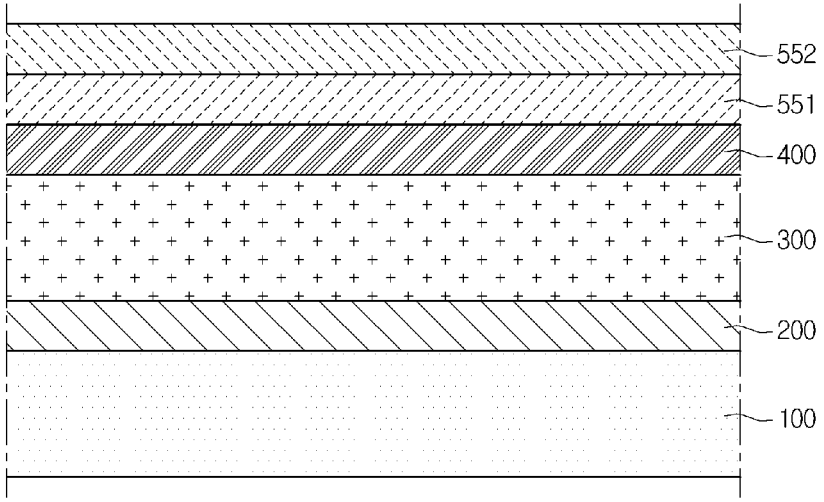
[Fig. 6]
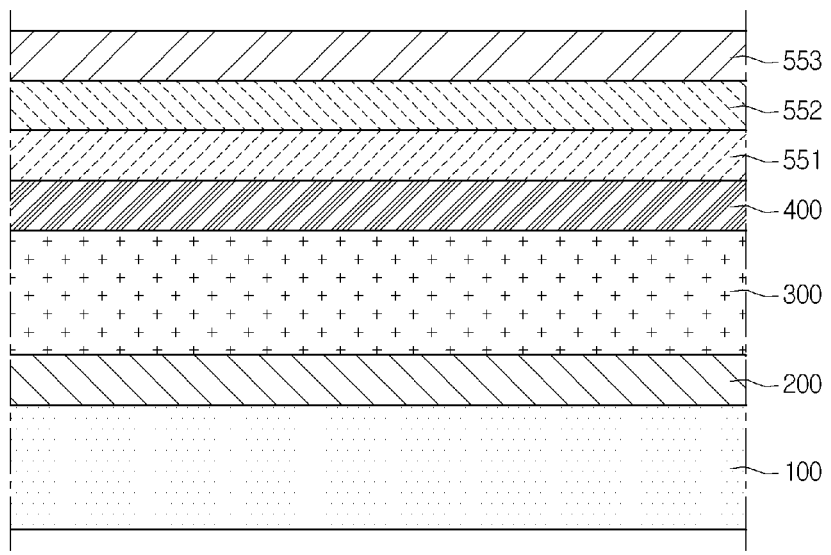

SOLAR CELL AND METHOD OF FABRICATING THE SAME

CROSS-REFERENCE TO RELATED APPLICATIONS

This application is the U.S. national stage application of International Patent Application No. PCT/KR2012/008446, filed Oct. 16, 2012, which claims priority to Korean Application No. 10-2011-0106117, filed Oct. 17, 2011, the disclosures of each of which are incorporated herein by reference in their entirety.

TECHNICAL FIELD

The embodiment relates to a solar cell and a method of fabricating the same.

BACKGROUND ART

A method of fabricating a solar cell for solar light power generation is as follows. First, after preparing a substrate, a back electrode layer is formed on the substrate and patterned by a laser, thereby forming a plurality of back electrodes.

Thereafter, a light absorbing layer, a buffer layer, and a high resistance buffer layer are sequentially formed on the back electrodes. Various schemes, such as a scheme of forming a Cu(In,Ga)Se2 (CIGS) based-light absorbing layer by simultaneously or separately evaporating Cu, In, Ga, and Se and a scheme of performing a selenization process after a metallic precursor film has been formed, have been extensively used in order to form the light absorbing layer. The energy band gap of the light absorbing layer is in the range of about 1 eV to 1.8 eV.

Then, a buffer layer including cadmium sulfide (CdS) is formed on the light absorbing layer through a sputtering process. The energy bandgap of the buffer layer may be in the range of about 2.2 eV to 2.4 eV. After that, a high resistance buffer layer including zinc oxide (ZnO) is formed on the buffer layer through the sputtering process. The energy bandgap of the high resistance buffer layer is in the range of about 3.1 eV to about 3.3 eV.

Thereafter, a groove pattern may be formed in the light absorbing layer, the buffer layer, and the high resistance buffer layer.

Then, a transparent conductive material is laminated on the high resistance buffer layer, and is filled in the groove pattern. Therefore, a transparent electrode layer is formed on the high resistance buffer layer, and connection wires are formed in the groove pattern. A material constituting the transparent electrode layer and the connection wireless may include aluminum doped zinc oxide (AZO). The energy bandgap of the transparent electrode layer may be in the range of about 3.1 eV to about 3.3 eV.

Then, the groove pattern is formed in the transparent electrode layer, so that a plurality of solar cells may be formed. The transparent electrodes and the high resistance buffers correspond to the cells, respectively. The transparent electrodes and the high resistance buffers may be provided in the form of a stripe or a matrix.

The transparent electrodes and the back electrodes are misaligned from each other, so that the transparent electrodes are electrically connected to the back electrodes through the connection wires. Accordingly, the solar cells may be electrically connected to each other in series.

As described above, in order to convert the solar light into electrical energy, various solar cell apparatuses have been fabricated and used. One of the solar cell apparatuses is disclosed in Korean Unexamined Patent Publication No. 10-2008-0088744.

Meanwhile, in the related art, a front electrode layer is formed by depositing a transparent conductive material such as Al doped zinc oxide (AZO) on a buffer layer through a sputtering process. The sputtering process causes a problem in that plasma damage is applied to the buffer layer so that a shunt path is increased. Instead of the sputtering process, there is proposed a method of forming a front electrode layer by depositing the AZO on the buffer layer through MOCVD or non-vacuum deposition. However, the method using the MOCVD has a difficulty in fabricating a precursor of aluminum for the MOCVD. In the method using the non-vacuum deposition, aluminum is not uniformly distributed during sintering and properties of the front electrode layer may be deteriorated due to a local cohesion property.

DISCLOSURE OF INVENTION

Technical Problem

The embodiment provides a solar cell capable of representing improved performance.

Solution to Problem

According to the embodiment, there is provided a solar cell including: a back electrode layer; a light absorbing layer on the back electrode layer; a buffer layer on the light absorbing layer; and a front electrode layer on the buffer layer, wherein the front electrode layer comprises an intrinsic region and a doping region having a conductive dopant, and a concentration of the conductive dopant is gradually lowered in upward and downward directions from an excess doping region of the doping region.

According to one embodiment, there is provided a method of fabricating a solar cell including: forming a back electrode layer on a substrate; forming a light absorbing layer on the back electrode layer; forming a buffer layer on the light absorbing layer; forming a first transparent conductive layer on the buffer layer; forming a dopant supply layer on the first transparent conductive layer; and forming a second transparent conductive layer on the dopant supply layer.

Advantageous Effects of Invention

In the solar cell and the method of fabricating the same according to the embodiment, the front electrode layer can be formed without performing a sputtering process, so that an influence on the buffer layer can be reduced. That is, plasma damage to the substrate is reduced so that electric short can be prevented and a fill factor can be increased. Accordingly, performance of a solar cell apparatus can be improved.

BRIEF DESCRIPTION OF DRAWINGS

FIG. 1 is a sectional view showing one section of a solar cell according to the embodiment;

FIG. 2 is a view showing a structure of a front electrode layer included in the solar cell according to the embodiment; and FIGS. 3 to 6 are sectional views showing a method of fabricating a solar cell according to the embodiment.

MODE FOR THE INVENTION

In the description of the embodiments, it will be understood that, when a substrate, a layer, a film, or an electrode is referred to as being "on" or "under" another substrate, another layer, another film, or another electrode, it can be "directly" or "indirectly" on the other substrate, layer, film, or electrode, or one or more intervening layers may also be present. Such a position of the layer has been described with reference to the drawings.

The size or the thickness of the layer (film), the region, the pattern or the structure may be modified exaggerated for the purpose of explanation and clarity. The size may not utterly reflect the actual size.

Hereinafter, an exemplary embodiment of the disclosure will be described with reference to the accompanying drawings.

The solar cell according to the embodiment will now be described in detail with reference to FIGS. 1 and 2. FIG. 1 is a sectional view showing one section of a solar cell according to the embodiment. FIG. 2 is a view showing a structure of a front electrode layer included in the solar cell according to the embodiment.

Referring to FIGS. 1 and 2, the solar cell according to the embodiment includes a support substrate 100, a back electrode layer 200, a light absorbing layer 300, a buffer layer 400, and a front electrode layer 500.

The support substrate 100 has a plate shape, and supports the back electrode layer 200, the light absorbing layer 300, the buffer layer 400, and the front electrode layer 500.

The support substrate 100 may include an insulator. The support substrate 100 may be a glass substrate, a plastic substrate, or a metal substrate. Meanwhile, the support substrate 100 may include soda lime glass. The support substrate 100 may be transparent, flexible or rigid.

The back electrode layer 200 is provided on a top surface of the support substrate 100. The back electrode layer 200 is a conductive layer. For example, a material used for the back electrode layer 200 may include metal such as molybdenum (Mo).

The back electrode layer 200 may include at least two layers. In this case, at least two layers may be formed by using the same metal or different metals.

The light absorbing layer 300 is provided on the back electrode layer 200. The light absorbing layer 300 may include group I-III-VI compounds. For instance, the light absorbing layer 300 may include the Cu (In,Ga)Se2 (CIGS) crystal structure, the Cu(In)Se2 crystal structure, or the Cu(Ga)Se2 crystal structure.

The energy band gap of the light absorbing layer 300 is in the range of about 1 eV to 1.8 eV.

The buffer layer 400 is provided on the light absorbing layer 300. The buffer layer 400 directly makes contact with the light absorbing layer 300.

The buffer layer 400 may include cadmium sulfide (CdS).

The front electrode layer 500 is provided on the light absorbing layer 300. In detail, the front electrode layer 500 is provided on the buffer layer 400.

The front electrode layer 500 is provided on the buffer layer 400 and is transparent.

The front electrode layer 500 includes an intrinsic region and a doping region 520.

The intrinsic region 510 is provided on the buffer 400. The intrinsic region 510 makes direct contact with the buffer layer 400. The intrinsic region 510 includes intrinsic zinc oxide. The intrinsic region 510 may have a thickness T in the range of 50 nm to 70 nm.

The doping region 520 is provided on the intrinsic region 510. The doping region 520 includes a conductive dopant. The conductive dopant may include aluminum (Al).

The doping region 520 includes an excess doping region 522. The excess doping region 522 may be located in a central portion of the doping region 520. The excess doping region 522 is a region having high concentration of the conductive dopant.

Meanwhile, referring to FIG. 2, the concentration of the conductive dopant is gradually lowered in upward and downward directions from the excess doping region 522. That is, the concentration of the conductive dopant is gradually lowered in upward and downward directions from a central portion of the excess doping region 522. In other words, the concentration of the conductive dopant may be gradually lowered from the excess doping region 522 to the intrinsic region 510 and a top surface of the excess doping region 522. For example, when the conductive dopant is aluminum, the concentration of the aluminum may be gradually lowered from the excess doping region 522 to the intrinsic region 510 and the top surface of the excess doping region 522. A thickness of the front electrode layer 500 may be in the range of about 500 nm to about 1.5 μm. When the front electrode layer 500 has AZO, the aluminum (Al) may be doped at the amount of about 1.5 wt % to about 3.5 wt %. The front electrode layer 500 is a conductive layer.

Hereinafter, a method of fabricating the solar cell according to the embodiment with reference to FIGS. 3 to 6. In the following description, for the purpose of clear and simple explanation, the details of structures and components the same as or similar to those in the first embodiment will be omitted.

FIGS. 3 to 6 are sectional views showing a method of fabricating a solar cell according to the embodiment.

The method of fabricating a solar cell according to the embodiment may include a step of forming a back electrode layer 200 on a support substrate 100, a step of forming a light absorbing layer 300, a step of forming a buffer layer 400, a step of forming a first transparent conductive layer 551, a step of forming a dopant supply 552, and a step of forming a second transparent conductive layer 553.

First, referring to FIG. 3, metal such as molybdenum (Mo) is deposited on a support substrate 100 and a back electrode layer 200 is formed. The back electrode layer 200 may be formed by two processes having different process conditions.

An additional layer such as a diffusion barrier layer may be interposed between the support substrate 100 and the back electrode layer 200.

Next, the light absorbing layer 300 is formed on the back electrode layer 200. The light absorbing layer 300 may be formed through a sputtering process or evaporation.

For instance, Cu, In, Ga and Se are simultaneously or independently evaporated to form the CIGS-based light absorbing layer 300, or the light absorbing layer 300 can be formed through the selenization process after forming a metal precursor layer.

In detail, the metal precursor layer is formed on the back electrode layer 200 by performing the sputtering process using a Cu target, an In target, and a Ga target.

Then, the selenization process is performed to form the CIGS-based light absorbing layer 300.

In addition, the sputtering process using the Cu target, the In target, and the Ga target and the selenization process can be simultaneously performed.

Moreover, a sputtering process and a selenization process may be performed to form a CIS or CIG-based light absorbing layer 300 using only the Cu target and the In target or only the Cu target and the Ga target.

Next, the buffer layer 400 is formed on the light absorbing layer 300. The buffer layer 400 may be formed through chemical bath deposition (CBD), a chemical vapor deposition (CVD) process, a spray scheme, or a physical vapor deposition (PVD) process.

After that, referring to FIG. 4, the first transparent conductive layer 551 is formed on the buffer layer 400. The first transparent conductive layer 551 may include zinc oxide. The first transparent conductive layer 551 may be formed by deposition. In detail, the first transparent conductive layer 551 may be formed through a metalorganic chemical vapor deposition (MOCVD) process. Since the first transparent conductive layer 551 can be formed without exerting the great influence on the buffer layer 400, the first transparent conductive layer 551 can be formed at a sufficient thickness.

Next, referring to FIG. 5, a dopant supply layer 552 may be formed on the first transparent conductive layer 551. The dopant supply layer 552 may include aluminum (Al). The dopant supply layer 552 may be formed through sputtering or deposition.

After that, referring to FIG. 6, a second transparent conductive layer 553 may be formed on the dopant supply layer 552. The second transparent conductive layer 553 may include zinc oxide. The second transparent conductive layer 553 may be formed by deposition. In detail, the second transparent conductive layer 553 may be formed through the MOCVD process in the same manner as in the first transparent conductive layer 551.

Next, after forming the second transparent conductive layer 553, a step of diffusing the first transparent conductive layer 551, the dopant supply layer 552, and the second transparent conductive layer through heat treatment may be performed. That is, the dopant supply layer 552 may be diffused through the heat treatment.

The step of diffusing the dopant supply layer 552 may be performed at a temperature less than or equal to 250° C. Accordingly, PN junction breakdown can be prevented.

The step of diffusing the dopant supply layer 552 may be performed for a time of 10 minutes or less. Accordingly, the above intrinsic region 510 may be ensured by preventing Aluminum (Al) of the dopant supply layer 552 from reaching a bottom surface of the transparent conductive layer 551.

In the embodiment, the first transparent conductive layer 551 and the second transparent conductive layer 553 are not formed through a sputtering process to reduce an influence on the buffer layer 400. That is, plasma damage of the substrate is reduced so that electric short can be prevented and a fill factor can be increased. Accordingly, performance of a solar cell apparatus can be improved.

In the related art, a front electrode layer is formed by depositing a transparent conductive material such as Al-doped zinc oxide (AZO) on a buffer layer 400 through a sputtering process. The sputtering process causes a problem in that plasma damage is applied to the buffer layer 400 so that a shunt path is increased. Instead of the sputtering process, there is proposed a method of forming a front electrode layer by depositing the AZO on the buffer layer through MOCVD or non-vacuum deposition. However, the method using the MOCVD has a difficulty in fabricating a precursor of aluminum for the MOCVD. In the method using the non-vacuum deposition, aluminum is not uniformly distributed during sintering and properties of the front electrode layer may be deteriorated due to a local cohesion property.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell comprising:
   a back electrode layer;
   a light absorbing layer on the back electrode layer;
   a buffer layer on the light absorbing layer; and
   a front electrode layer on the buffer layer;
   wherein the front electrode layer is transparent and includes zinc oxide;
   wherein the front electrode layer comprises an intrinsic region provided on the buffer layer and a doping region provided on the intrinsic region;
   wherein the intrinsic region includes intrinsic zinc oxide;
   wherein the doping region includes a conductive dopant;
   wherein a concentration of the conductive dopant is gradually lowered from an excess doping region located in a central portion of the doping region to a bottom surface and a top surface of the doping region;
   wherein a concentration of the conductive dopant of the top surface is lower than a concentration of the conductive dopant of the central portion and higher than a concentration of the conductive dopant of the bottom surface;
   wherein the front electrode layer has a thickness in a range of 500 nm to 1.5 µm;
   wherein the intrinsic region has a thickness in a range of 50 nm to 70 nm;
   wherein a thickness of the doping region is thicker than that of the intrinsic region,
   wherein the conductive dopant comprises aluminum, and
   wherein the aluminum is doped at an amount in a range of from 3.1 wt % to 3.5 wt %.

2. The solar cell of claim 1, wherein the doping region directly makes contact with the intrinsic region.

3. The solar cell of claim 1, wherein the intrinsic region directly makes contact with the buffer layer.

4. A method of fabricating a solar cell, the method comprising:
   forming a back electrode layer on a substrate;
   forming a light absorbing layer on the back electrode layer;
   forming a buffer layer on the light absorbing layer;
   forming a first transparent conductive layer on the buffer layer;
   forming a dopant supply layer on the first transparent conductive layer;

forming a second transparent conductive layer on the dopant supply layer; and diffusing the dopant supply layer through a heat treatment after the forming of the second transparent conductive layer;

wherein the first transparent conductive layer and the second transparent conductive layer comprise zinc oxide, wherein the first transparent conductive layer and the second transparent conductive layer are formed through a metal-organic chemical vapor deposition (MOCVD) process, wherein the dopant supply layer is formed through a sputtering process, wherein, after the diffusing of the dopant supply layer, a front electrode layer is formed on the buffer layer;

wherein the front electrode layer comprises an intrinsic region provided on the buffer layer and a doping region provided on the intrinsic region;

wherein the intrinsic region includes intrinsic zinc oxide;

wherein the doping region includes a conductive dopant;

wherein a concentration of the conductive dopant is gradually lowered from an excess doping region located in a central portion of the doping region to a bottom surface and a top surface of the doping region;

wherein a concentration of the conductive dopant of the top surface is lower than a concentration of the conductive dopant of the central portion and higher than a concentration of the conductive dopant of the bottom surface;

wherein the front electrode layer has a thickness in a range of from 500 nm to 1.5 µm;

wherein the intrinsic region has a thickness in a range of from 50 nm to 70 nm;

wherein a thickness of the doping region is thicker than that of the intrinsic region, wherein the conductive dopant comprises aluminum, and wherein the aluminum is doped at an amount in a range of from 3.1 wt % to 3.5 wt %.

5. The method of claim 4, wherein the diffusing of the dopant supply layer is performed at a temperature less than or equal to 250° C.

* * * * *